(12) United States Patent
Liu

(10) Patent No.: US 7,560,201 B2
(45) Date of Patent: Jul. 14, 2009

(54) PATTERNING A SINGLE INTEGRATED CIRCUIT LAYER USING MULTIPLE MASKS AND MULTIPLE MASKING LAYERS

(75) Inventor: Tsu-Jae King Liu, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/178,472

(22) Filed: Jul. 23, 2008

(65) Prior Publication Data

US 2008/0280217 A1 Nov. 13, 2008

Related U.S. Application Data

(63) Continuation-in-part of application No. 11/420,217, filed on May 24, 2006.

(51) Int. Cl.
*G03F 9/00* (2006.01)
*G03C 5/00* (2006.01)

(52) U.S. Cl. .............................. 430/5; 430/30; 430/302; 430/312; 430/313; 430/314; 430/315; 430/316; 430/319; 430/328; 355/53

(58) Field of Classification Search ..................... 430/5, 430/30, 302, 312, 313, 314, 315, 316, 319, 430/328; 355/53

See application file for complete search history.

(56) References Cited

U.S. PATENT DOCUMENTS

| 7,253,118 B2 | 8/2007 | Tran et al. |
| 2005/0073671 A1 | 4/2005 | Borodovsky |

2007/0249170 A1 10/2007 Kewley

OTHER PUBLICATIONS

Borodovsky, "Marching to the Beat of Moore's Law", SPIE Microlithography, Feb. 2006, San Jose, CA, Intel, pp. 1-75.
Brueck, "Optical and Interferometric Lithography—Nanotechnology Enablers", Proceedings of the IEEE, vol. 93, No. 10, Oct. 2005, pp. 1704-1721.
Choi et al., "A Spacer Patterning Technology for Nanoscale CMOS", IEEE Transactions On Electron Devices, vol. 49, No. 3, Mar. 2002, pp. 436-441.
Colburn et al., "Step and Flash Imprint Lithography for Sub-100nm Patterning", Texas Materials Institute and Agilent Technologies Laboratory, 5 pgs.
Webb, Clair, "Intel Design for Manufacturing and Evolution of Design Rules", Design for Manufacturability through Design-Process Integration II, edited by Vivek K. Singh, Michael L. Rieger, Proc. of SPIE vol. 6925, 692503 (2008), 8 pages.

*Primary Examiner*—Christopher G Young
(74) *Attorney, Agent, or Firm*—Bever, Hoffman & Harms, LLP; Jeanette S. Harms

(57) ABSTRACT

A multiple mask and a multiple masking layer technique can be used to pattern a single IC layer. A resolution enhancement technique can be used to define one or more fine-line patterns in a first masking layer, wherein each fine-line feature is sub-wavelength. Moreover, the pitch of each fine-line pattern is less than or equal to that wavelength. The portions of the fine-line features not needed to implement the circuit design are then removed or designated for removal using a mask. After patterning of the first masking layer, another mask can then be used to define coarse features in a second masking layer formed over the patterned first masking layer. At least one coarse feature is defined to connect two fine-line features, wherein the coarse feature(s) can be derived from a desired layout using a shrink/grow operation. The IC layer can be patterned using the composite mask formed by the patterned first and second masking layers.

15 Claims, 11 Drawing Sheets

PATTERNING A SINGLE INTEGRATED CIRCUIT LAYER USING MULTIPLE MASKS AND MULTIPLE MASKING LAYERS

RELATED APPLICATIONS

This application is a continuation-in-part of U.S. patent application Ser. No. 11/420,217, entitled "Patterning A Single Integrated Circuit Layer Using Multiple Masks And Multiple Masking Layers" filed May 24, 2006.

BACKGROUND OF THE INVENTION

1. Field of the Invention

The present invention relates to forming features of an integrated circuit (IC) and in particular achieving sub-wavelength resolution of certain features in the IC in a cost-effective manner.

2. Description of the Related Art

In designing an integrated circuit (IC), engineers typically rely upon computer simulation tools to help create a schematic circuit design consisting of individual circuit elements electrically coupled together in order to perform certain functions. To actually fabricate this integrated circuit in a semiconductor substrate, the circuit design must be translated into a physical representation, or layout, which itself can then be transferred onto a series of templates (e.g. masks) used to sequentially pattern layers in or on the semiconductor substrate surface. Computer aided design (CAD) tools assist layout designers in the task of translating the circuit design into a series of two-dimensional patterns that will define the component layers of the IC, such as the active device regions, gate electrodes, contact holes, metal interconnections, and so on.

A method of transferring a layout pattern to the semiconductor substrate surface is to use the process of optical lithography (photolithography) in which the layout pattern is first transferred onto a physical template that in turn is used to optically project the layout pattern onto the surface of the semiconductor substrate (hereinafter wafer).

In transferring the IC layout to physical templates, a mask is generally created for each layer of the IC. For example, the data representing the layout pattern for a specific layer (e.g. the gate electrode layer) can be input into an electron beam machine that writes the layout pattern onto a blank mask. After the mask is made, it is used to optically project the layout pattern onto many wafers, one at a time. This optical projection is done by shining light through the mask onto the wafer. Optical lenses and/or mirrors may be used to direct, demagnify, and/or focus the mask image onto the wafer surface. Prior to exposure, the wafer is first coated with a masking layer of photosensitive material that is resistant to being etched and is hence referred to as photoresist.

For a binary mask, light passes through the clear regions of the mask, thereby exposing the photoresist coating in these regions. In contrast, light is blocked by the opaque regions of the binary mask, thereby leaving the photoresist coating unexposed in these regions. When the photoresist coating is then developed in a chemical solution, either the exposed regions (for a positive photoresist) or unexposed regions (for a negative photoresist) are selectively removed. The end result is a wafer coated with a layer of photoresist exhibiting a desired pattern to define the geometries, features, lines, and shapes of an underlying layer or an overlying layer. The photoresist layer is then removed after the underlying layer is processed (e.g. etched) or after the overlying layer is deposited, respectively. This photolithography process is used to define each layer of the IC, generally using a separate mask for each layer.

FIG. 1 illustrates a graph 100 plotting length (on a logarithmic scale) versus year. As indicated, the wavelength of light used in photolithography (shown by curve 101) to define features on a wafer was shorter than the minimum lithographically defined feature size of an IC (shown by curve 102) before 1996, i.e. until approximately the 0.25 μm (minimum half-pitch) technology node. In this time period, synthesis of the layout patterns and their transfer from the mask to the wafer were relatively straightforward with minimal distortions. For example, FIG. 2 illustrates features 204, 205, and 206 at the 0.25 μm (250 nm) technology node, which were generated during a design stage 201, a mask stage 202, and a wafer stage 203, respectively. At this technology node, a mask can merely comprise the geometric shapes that represent the desired layout pattern for its corresponding layer.

As indicated in graph 100 (FIG. 1), after the 0.25 μm technology node, the minimum feature size has been increasingly smaller than the wavelength of light used in photolithography. Thus, in many CMOS (complementary metal-oxide-semiconductor) IC products currently manufactured, the minimum feature size (e.g. the minimum gate length $L_{gmin}$ of a transistor) is much smaller than the wavelength of light used in the photolithography process to define it. In this sub-wavelength photolithography regime, resolution enhancement techniques (RETs) are required at mask stage 202 to achieve the desired layout patterns on the wafer, i.e. at wafer stage 203.

For example, at the 0.18 μm (180 nm) technology node, shown in FIG. 2, a design feature 207, if merely reproduced as mask feature 208, would result in a poorly defined wafer feature 210. To achieve acceptable definition, RETs such as rule-based optical proximity correction (OPC) and model-based OPC can be used to generate an OPC-corrected mask feature 209, which in turn can be used generate a wafer feature 211. Rule-based OPC features can include serifs, hammerheads, and assist bars. In model-based OPC, edge segments of the design feature can be moved. In either OPC approach, the original design feature is modified to compensate for proximity effects.

Smaller technology nodes require yet more complex layout patterns at the mask stage. For example, at the 0.09 μm (90 nm) technology node and beyond, a design feature 212 reproduced simply as mask feature 213 will not even print in wafer stage 203. Another RET, called phase shifting, can be used to generate a phase-shifted mask feature 214. Phase shifting, in general, enhances the contrast of the lithography process. However, at this technology node, phase shifting by itself can only generate a poorly defined wafer feature 216. Therefore, a combination of OPC and phase shifting RETs is needed to generate feature 215, which in turn can generate a wafer feature 217 that is true to the design feature 212.

Notably, such complex RETs can make sub-wavelength resolution possible, but at increased design and manufacturing (e.g. photolithography) cost. Unfortunately, because of the widening gap between the wavelength of light and the minimum feature size with technology advancement over time, this cost is expected to significantly increase with each new generation of integrated circuit technology.

Therefore a need arises for a technique to provide good sub-wavelength feature definition in a cost effective manner.

SUMMARY OF THE INVENTION

Multiple masks and multiple masking layers on the surface of the wafer can be used to pattern a single integrated circuit (IC) layer with superior fidelity to design. In one embodiment, a first mask made using one or more resolution enhancement techniques (RETs) can be used to define one or more geometrically regular fine-line patterns in a first masking layer on the surface of the wafer. Notably, each feature defined in the first masking layer is sub-wavelength, i.e. its width is less than the wavelength of light used to form it, and therefore is called a fine-line feature. Moreover, the pitch (sum of a line width and a space width) of each fine-line pattern is less than or equal to that wavelength. The lines within each fine-line pattern may have a substantially equal width. The spaces within each fine-line pattern may or may not have a width equal to the width of the lines. Because this first mask defines only fine-line features, it can be used to define (at least in part) the same IC layer in multiple products (e.g. the gate electrode layer for different IC designs). Thus, although its cost may be high due to the use of one or more RETS, the mask cost per IC design can be lower than for the conventional case in which a single mask is used to fully define an IC layer.

Portions of the fine-line pattern(s) that are not needed to implement the circuit design can then be removed from the first masking layer using a second mask. For a positive photoresist, the second mask additionally exposes areas in which the fine-line features are not to be retained and protects any desired portion of the fine-line features defined using the first mask. The minimum lateral dimension of the features on this second mask can be greater than the pitch of the fine-line pattern(s), which is significantly larger than the width(s) of the fine-line features. Thus, fewer (if any) RETs are needed to make the second mask. Therefore, the cost of the second mask can be substantially lower than for a single mask used to define the IC layer.

After this exposure, the first masking layer can be patterned via photoresist development or a combination of photoresist development and etching (in the case where a hard masking layer is included in the first masking layer). At this point, the patterned first masking layer directly corresponds to the desired fine-line features of the IC layer.

A second masking layer (e.g. photoresist) can then be used to connect fine-line features of the first masking layer together where desired, and also to form other coarse features. These coarse features can be defined by accessing a desired layout of the IC layer, performing a shrink operation until any fine-line pattern on the desired layout disappears, and then performing a grow operation on the shrunk layout so that any coarse feature has substantially a same size as that on the desired layout. In one embodiment, the shrink/grow amount is at least one-half the width of the fine-line features. The second masking layer is exposed using a third mask. The minimum lateral dimension of the features on this third mask is greater than the width(s) of the fine-line features and can be equal to or greater than the pitch of the fine-line pattern(s). Thus, fewer (if any) RETs, such as optical proximity correction, are needed to make the third mask. Therefore, the cost of the third mask can be substantially lower than for a single mask used to define the IC layer. After this exposure, the second masking layer can be patterned.

At this point, the underlying IC layer can be patterned using the composite mask formed by the patterned first and second masking layers. The IC patterning process can include the etching, isotropic or anistropic (as appropriate), of the IC layer. After the IC layer is patterned, at least the photoresist layer(s) of the first and second masking layers, and any other layers unnecessary for IC device fabrication, can be removed.

In another embodiment, the first mask is made with or without RETs, and is used to define a pattern of lines in a sacrificial hard masking layer on the surface of the wafer. A photoresist layer is coated onto the sacrificial hard masking layer, exposed using the first mask, and then developed. Etching is then used to transfer the pattern in the photoresist to the sacrificial hard masking layer. In this process, the width of the lines may be narrowed by trimming the photoresist and/or by overetching the sacrificial hard masking layer. The photoresist is then removed.

Narrow "spacers" are then formed along the sidewalls of these lines by conformal deposition and anisotropic etching of the first hard masking layer. The width of the spacers thusly formed is correlated with the thickness of the deposited spacer layer, and hence can be sub-wavelength in dimension. Upon subsequent removal of the sacrificial hard masking layer, the spacers formed with the first hard masking layer form one or more geometrically regular fine-line patterns including only fine-line features.

Note again that each fine-line feature is sub-wavelength, i.e. narrower than the wavelength of light used to form it, and that the pitch of each fine-line pattern is less than or equal to that wavelength. An advantage of the spacer hard mask approach is that the width of the fine-line features is determined by the thickness of a deposited layer, which can be highly uniform across a wafer and from wafer to wafer, providing for superior control of this critical dimension (CD) than provided by the conventional photoresist mask approach.

Portions of the fine-line spacers that are not needed to implement the circuit design can then be removed from the first masking layer by photolithography and etching using a second mask. For a positive photoresist, the second mask exposes areas in which the fine-line spacers are not to be retained and protects any desired portion of the fine-line spacers. In one embodiment, the minimum lateral dimension of the features on this second mask are greater than the pitch of the fine-line spacer pattern(s), which is significantly larger than the width(s) of the spacers. In another embodiment, the minimum lateral dimension of the features on the second mask may be less than the pitch of the fine-line spacer pattern (s). In either case, fewer (if any) RETs are needed to make the second mask so that its cost can be substantially lower than for a single mask used to define the IC layer. At this point, the patterned first masking layer directly corresponds to the desired fine-line features of the IC layer.

A second masking layer (e.g. photoresist) can then be used to connect fine-line features of the first masking layer together where desired, and also to form other coarse features. In one embodiment, the coarse features can be derived from a desired layout of the IC layer using a shrink/grow operation. In one embodiment, the shrink/grow amount is at least one-half the width of the fine-line features. The second masking layer is patterned using a third mask. The minimum lateral dimension of the features on this third mask is greater than the width(s) of the fine-line features and can be equal to or greater than the pitch of the fine-line patterns. Thus, fewer (if any) RETS, such as optical proximity correction, are needed to make this mask so that its cost can be substantially lower than for a single mask used to define the IC layer.

At this point, the underlying IC layer can be patterned using the composite mask formed by the first and second masking layers. The patterning process can include the etching, isotropic or anistropic (as appropriate), of the IC layer. After the IC layer is patterned, at least the photoresist layer(s) of the first and/or second masking layers, and any other layers unnecessary for IC device fabrication, can be removed.

Note that the multiple masks and multiple masking layers result in fine-line patterns, wherein each fine-line pattern includes fine-line features that are oriented in a single direction and that are laid out on a regular grid. This positioning can advantageously minimize feature variations for improved yield as well as facilitate the use of RETs to achieve the most aggressively small feature sizes for optimized circuit performance. Moreover, multiple masks and multiple masking layers can significantly reduce mask complexity, thereby achieving high-fidelity layer patterning at lower overall cost.

DETAILED DESCRIPTION OF THE INVENTION

Notably, for each integrated circuit (IC) layer, many of the features can be characterized as having a periodic (or at least a quasi-periodic) pattern. This periodicity can be advantageously leveraged in simplifying the patterns transferred to multiple masking layers on the wafer. As discussed above, any bends or corners on a mask feature at sub-wavelength technology nodes can significantly deteriorate pattern fidelity on the wafer. Therefore, using a simplified pattern on a mask (or for any pattern transfer tool) can facilitate optimized resolution of the (quasi-)periodic pattern on the wafer.

For example, in one embodiment, a first mask can be used to define one or more geometrically regular fine-line patterns in a first masking layer on the surface of the wafer. Notably, each feature defined by the first mask is sub-wavelength i.e. its width is less than the wavelength of light used to form that feature, and therefore is called a fine-line feature herein.

Figure 1:
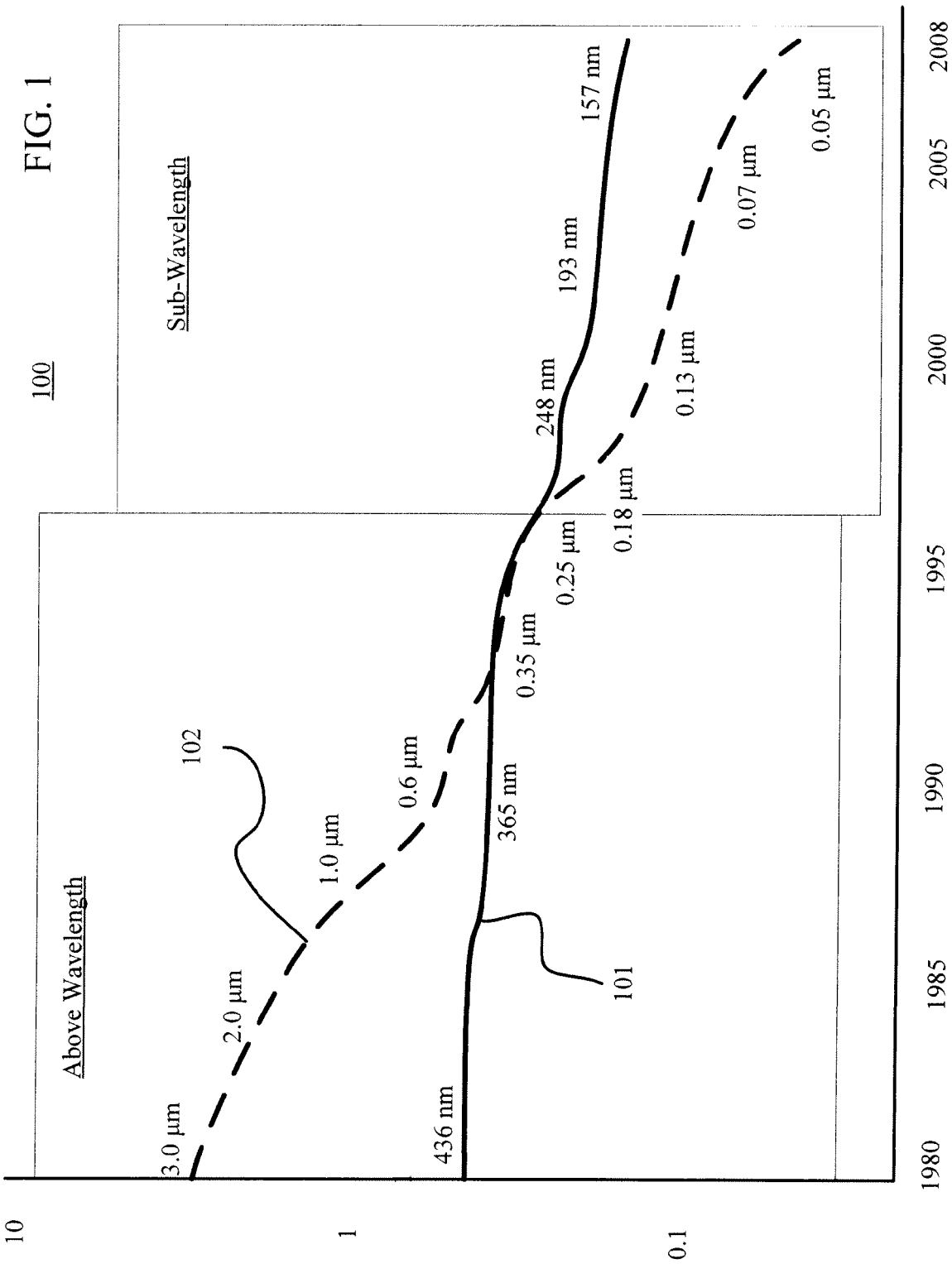
FIG. 1 illustrates a graph plotting the wavelength of light used in photolithography for the manufacture of CMOS (complementary metal-oxide-semiconductor) integrated circuits (ICs) and the minimum half-pitch of features on the most advanced ICs, versus year.
Figure 2:
FIG. 2 illustrates design features, mask features, and printed wafer features at various technology nodes (designated by minimum half-pitch).
Figure 3C:
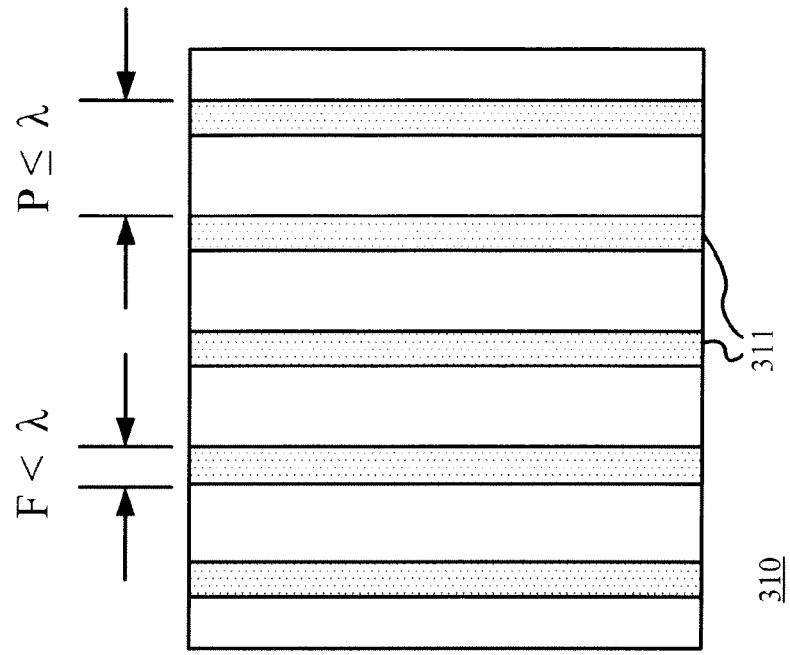
FIG. 3C illustrates a geometrically regular fine-line pattern that can be defined in a masking layer on a wafer using the mask of FIG. 3B.
Figure 3A:
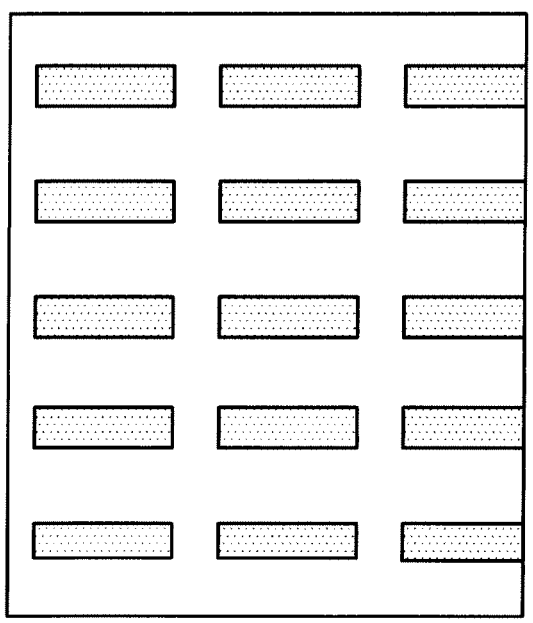
FIG. 3A illustrates a simple layout design for an IC layer that includes a plurality of parallel features.
Figure 3B:
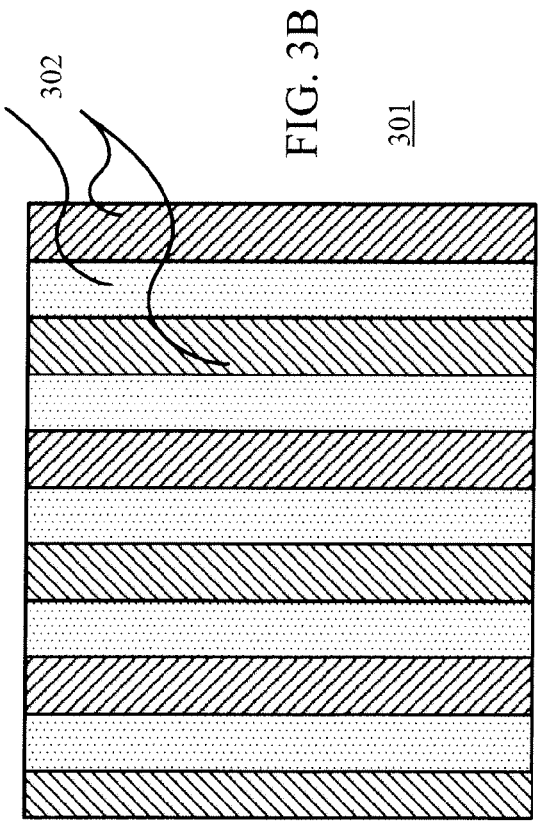
FIG. 3B illustrates a mask, including phase shifters placed on either side of parallel features, that can be used to transfer a stripe pattern corresponding to the simple layout of FIG. 3A to a masking layer on a wafer.

FIG. 3A illustrates a simple layout 300 for an IC layer. The parallel features of layout 300 could represent, for example, the gates of transistors that form a memory array. FIG. 3B illustrates a mask 301 including phase shifters 302 (0 degree phase shifters and 180 degree phase shifters shown by different cross-hatching patterns) that can be placed on either side of parallel features 303 to transfer a stripe pattern corresponding to layout 300 to a first masking layer on a wafer. Advantageously, because of its geometrically regular pattern, mask 301 can be used to define (in part) the same IC layer in multiple products (e.g. the gate electrode layer for different IC designs). Thus, although the cost of mask 301 may be high due to the use of one or more RETs (further described below), the mask cost per IC design can be lower than for the conventional case in which a single mask is used to fully define an IC layer.

FIG. 3C illustrates a geometrically regular pattern 310 of fine-line features 311 that can be defined in the first masking layer on the wafer by using mask 301. The first masking layer could comprise, for example, photoresist or a composite masking layer including photoresist and one or more underlying layers. In the case of patterning a composite masking layer, the photoresist (top layer) can be first developed whereas the underlying layer(s) (called a "hard" masking layer) can be subsequently etched. Note that many types of materials can be used for a hard masking layer, e.g. silicon, silicon dioxide, silicon oxynitride, silicon nitride, silicon carbide, silicide, amorphous carbon, aluminum, titanium, titanium nitride, tantalum nitride, tungsten, an organic or inorganic matrix. Thus, the first masking layer can, in general, refer to any single or composite layer formed on the wafer that facilitates pattern transfer to the IC layer.

Notably, each fine-line feature 311 has a minimum width F that is less than the wavelength ($\lambda$) of light used to form that feature. Moreover, the pitch (P) of the fine-line pattern, which can be defined as the sum of the minimum width F and a minimum spacing between features, is also less than or equal to that wavelength $\lambda$. Because of the simplicity of fine-line pattern 310, mask 301 can provide optimized resolution of fine-line features 311 on the first masking layer at minimal cost.

Note that the use of phase shifting in mask 301 is an exemplary RET. In other embodiments, other RETs can be used. Also, interferometric lithography, nanoimprint lithography, or spacer lithography can be used to transfer a stripe pattern to a first masking layer on a wafer. In interferometric lithography, two or more interfering coherent optical beams result in a light exposure pattern of alternating exposed lines and unexposed lines, which is used to form lines and spaces in a photoresist masking layer. The lines and spaces may have a pitch P approaching $\lambda/2$, where $\lambda$ is the radiation wavelength used in the interference lithography process. The minimum feature size of a line or space may be as small as the exposure wavelength divided by four ($\lambda/4$). Nanoimprint lithography forms fine-line features from a masking layer (e.g. photoresist) by mechanically deforming it using a physical mold.

Figure 3D:
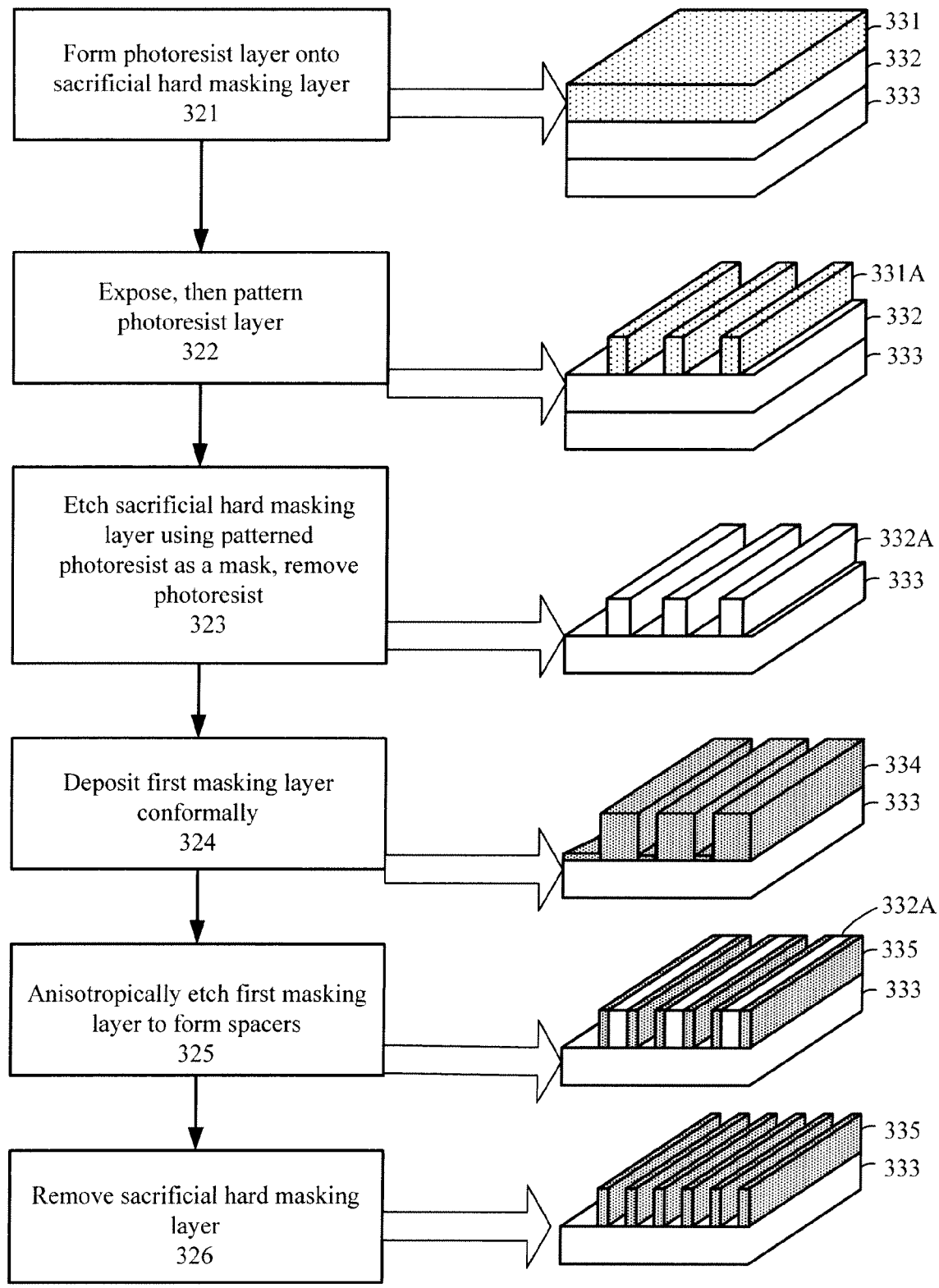
FIG. 3D illustrates exemplary steps for forming a hard masking layer with a geometrically regular fine-line pattern.

FIG. 3D illustrates a flow chart including exemplary steps to form the fine-line features in a first masking layer using spacer lithography. Block arrows point from the steps to their corresponding resulting structures on a wafer. In step 321, a photoresist layer 331 is coated onto a sacrificial hard masking layer 332 (which is formed on another IC layer 333). In step 322, photoresist layer 331 is exposed using a first mask and then developed to form patterned photoresist 331A. Note that this first mask can be made with or without using one or more RETs. In step 323, sacrificial hard masking layer 332 is etched to form patterned sacrificial hard masking layer 332A and patterned photoresist 331A is removed. In one embodiment, the width of the features in patterned sacrificial hard masking layer 332A may be adjusted by trimming the photoresist and/or by over-etching the sacrificial hard masking layer.

In step 324, the first hard masking layer 334 is deposited conformally over the patterned sacrificial hard masking layer 332A, e.g. by chemical vapor deposition (CVD). In step 325, the first hard masking layer 334 is anisotropically etched, thereby leaving "spacers" 335 of the first hard masking layer along the sidewalls of the patterned sacrificial hard masking layer 332A. The width of spacers 335 (exaggerated with respect to the width of the features in patterned sacrificial hard masking layer 332A to more clearly show spacers 335) is correlated with the thickness of the deposited first hard masking layer, and hence can be sub-wavelength in dimension. In step 326, patterned sacrificial hard masking layer 332A is selectively removed, thereby leaving spacers 335 formed in one or more geometrically regular fine-line patterns on IC layer 333. At this point, another masking layer (e.g. photoresist) can be formed over spacers 335. For ease of description, this additional masking layer will be characterized as part of the first masking layer.

Notably, each fine-line feature (spacer) is sub-wavelength, i.e. narrower than the wavelength of light used to form it, and the pitch of the fine-line pattern is less than or equal to that wavelength. One advantage of spacer lithography is that the width of the fine-line features is determined by the thickness of a deposited layer, which can be highly uniform across a wafer and from wafer to wafer. Therefore, spacer lithography can provide for superior control of this critical dimension (CD) compared to a conventional photoresist masking layer approach.

Portions of the fine-line pattern(s) that are not needed to implement the circuit design can then be removed or at least designated for removal from the first masking layer by using a second mask. The second mask exposes areas in which the fine-line features are not to be retained and protects any desired portion of the fine-line features defined using (or, in the case of spacer lithography, derived from) the first mask.

Figure 4:
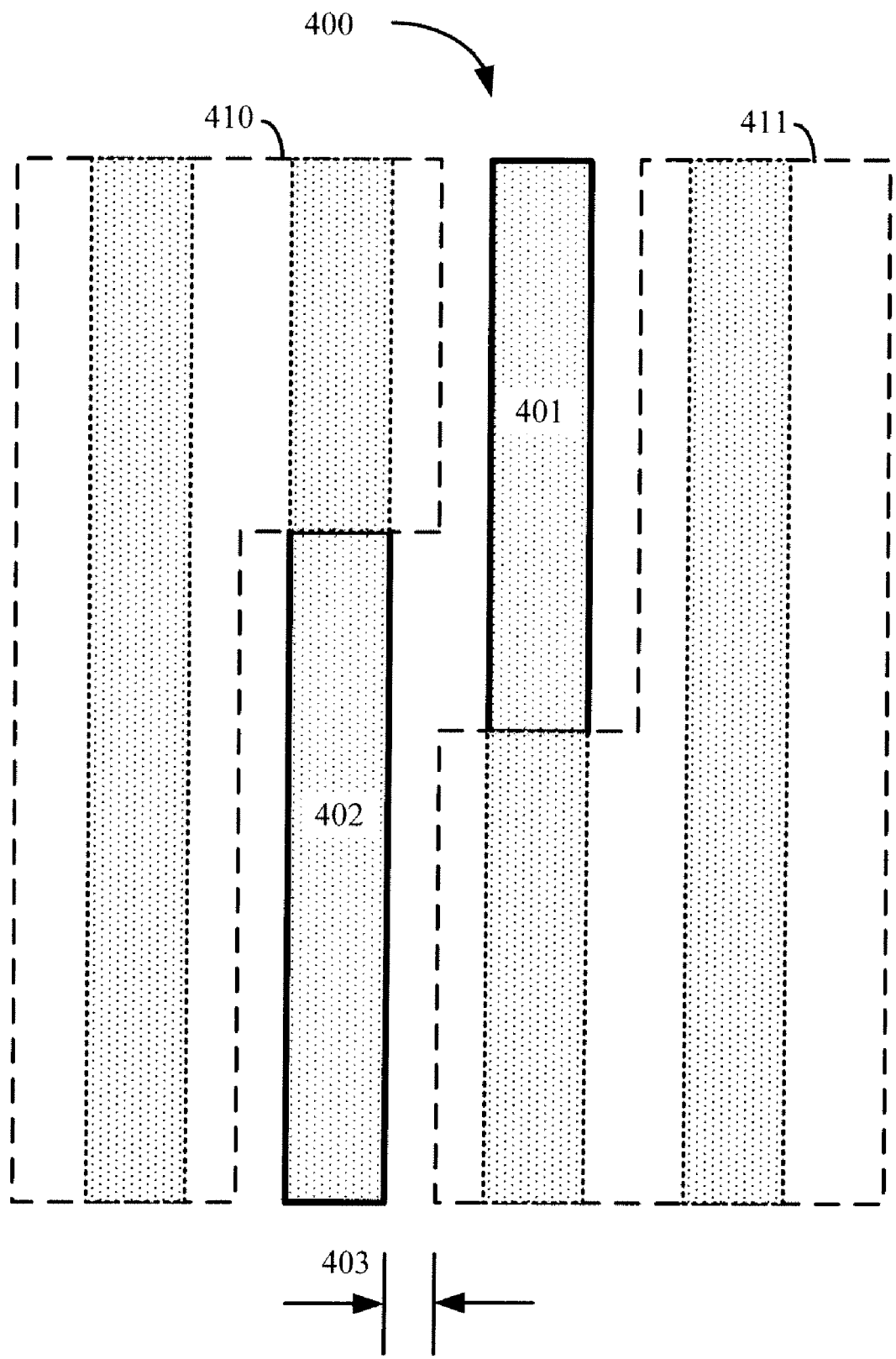
FIG. 4 illustrates a masking layer in which a fine-line pattern including two desired fine-line features is defined, wherein the regions in which fine-line features are not needed to implement the circuit design are indicated.

FIG. 4 illustrates a masking layer 400 in which a fine-line pattern, including two desired fine-line features 401 and 402 needed to implement the circuit design, is defined. Removal areas 410 and 411 (which encompass portions of the fine-line pattern not needed to implement the circuit design) are also shown in FIG. 4. Note that the misalignment tolerance between a fine-line feature and a removal area is (P−F)/2. Thus, for example, a misalignment tolerance 403 between fine-line feature 402 and removal area 411 is (P−F)/2.

Figure 3E:
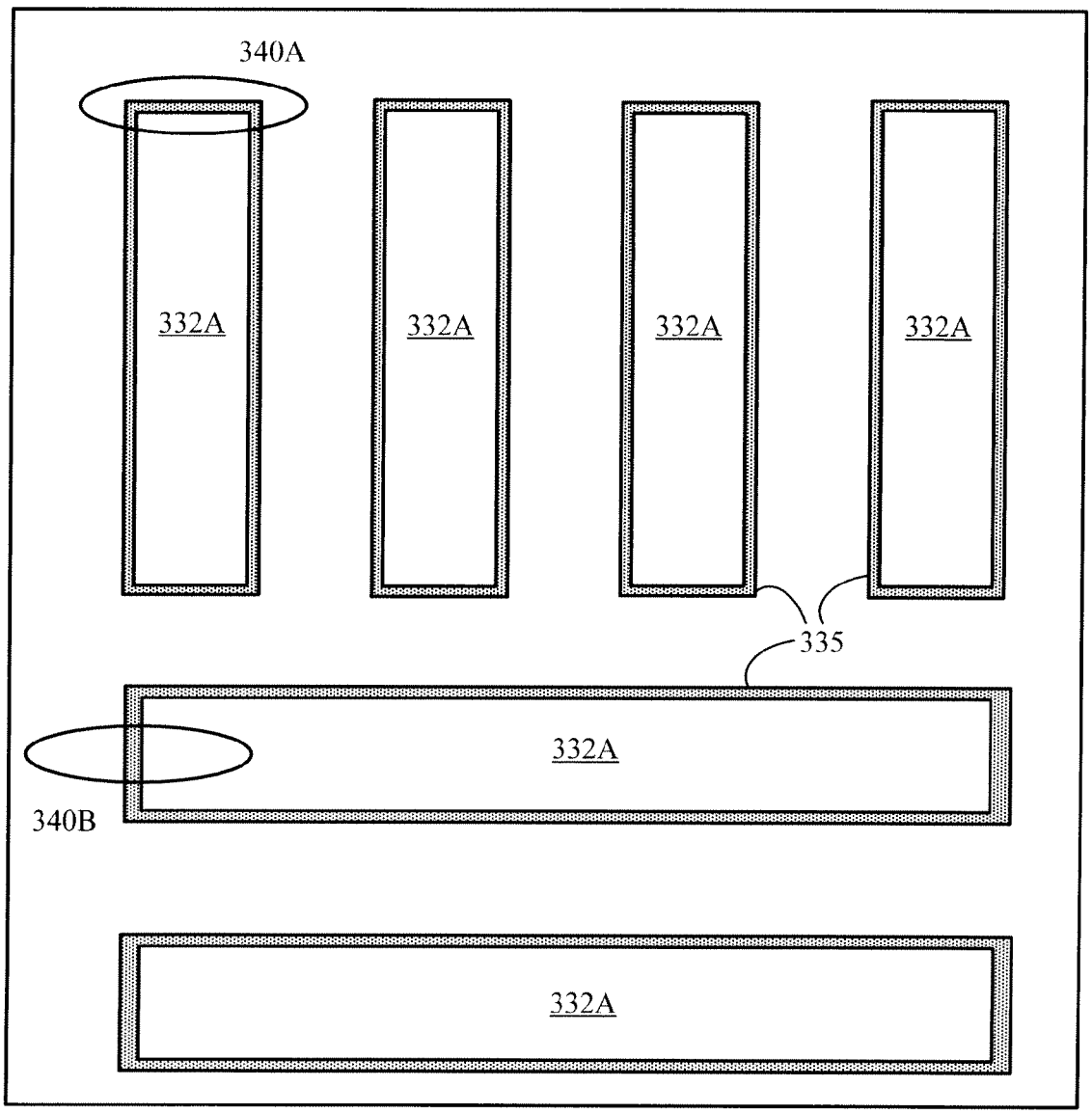
FIG. 3E illustrates a plan view of hard mask spacer patterns formed using the process of FIG. 3D.

Note that with respect to spacer lithography, the anisotropic etch process of step 325 would actually result in spacers 335 along each sidewall of the features of patterned sacrificial hard masking layer 332A as shown in FIG. 3E. Therefore, the second mask can also be used to remove portions 340A and/or portions 340B of the fine-line features.

In one embodiment, the minimum lateral dimension of the features on the second mask are greater than the pitch P of the fine-line pattern(s), which is significantly larger than the width(s) of the fine-line features. In another embodiment in which the fine-line features are formed using spacer lithography, the minimum lateral dimension of the features on the second mask may be less than the pitch P of the fine-line spacer pattern(s) and may even have feature widths smaller than that on the first mask. In either case, few (if any) RETs are needed to make the second mask. Thus, the cost of the second mask can be substantially lower than for a single mask used to define the IC layer.

After exposure using the second mask, the first masking layer can be patterned via conventional methods. For example, in one embodiment, if the first masking layer includes only a photoresist layer, then a photoresist development step can be used for patterning the first masking layer. In another embodiment, if the first masking layer includes a photoresist layer (top layer) and a hard masking layer (one or more layers under the top layer), then a photoresist development step as well as one or more etching steps can be used.

At this point, a second masking layer (e.g. a photoresist layer) can then be formed on the IC layer. The second masking layer can be used to connect fine-line features of the first masking layer, where desired, and also to form coarse features (e.g. pads). A third mask can be used to expose the second masking layer. The features on the third mask have a minimum lateral dimension greater than the width(s) of the fine-line features and can be equal to or greater than the pitch P of the fine-line pattern(s).

Figure 5:
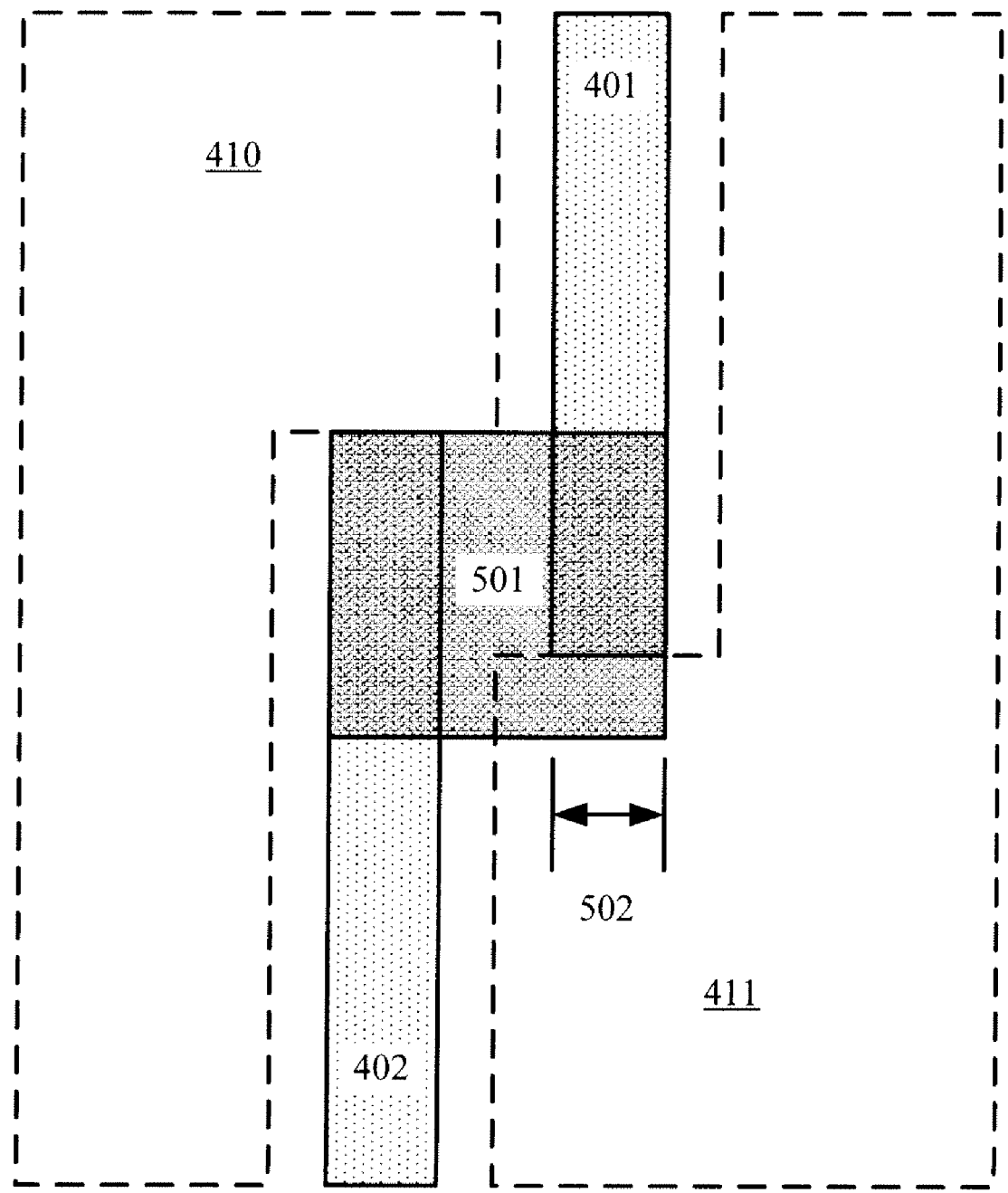
FIG. 5 illustrates a coarse feature that can be defined in a second masking layer to connect fine-line features of a first masking layer together where desired.

FIG. 5 illustrates a coarse feature 501 that can be patterned in the second masking layer to connect fine-line features 401 and 402 together. Note that feature removal areas 410 and 411 are shown for reference only. The misalignment tolerance of a coarse feature placed relative to a fine-line feature is greater than or equal to minimum width F and less than pitch P. Thus, an alignment tolerance 502 of coarse feature 501 with respect to fine-line feature 401 is greater than or equal to minimum feature width F and less than pitch P. In one embodiment, alignment tolerance 502 is greater than or equal to minimum feature width F and less than half-pitch (P/2).

Figure 6:
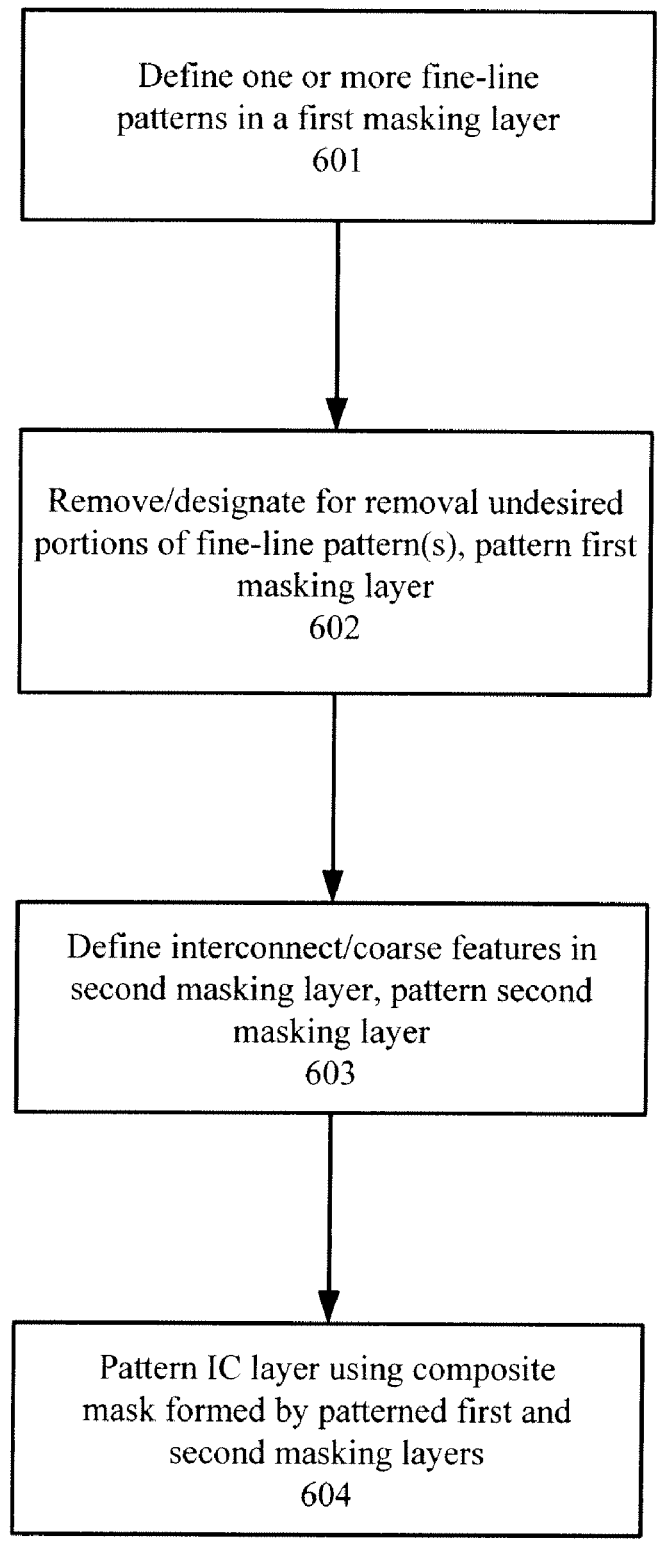
FIG. 6 illustrates exemplary steps for a multiple mask and multiple masking layer technique to pattern a single IC layer with superior fidelity to design.

FIG. 6 illustrates exemplary steps for a multiple mask and multiple masking layer technique to pattern a single IC layer with superior fidelity. In step 601, one or more fine-line patterns can be defined in a first masking layer, wherein each fine-line feature is sub-wavelength, i.e. its width is less than the wavelength of the light used to form it, and the pitch of each fine-line pattern is less than or equal to that wavelength. Techniques for providing the fine-line pattern(s) could include photolithography using a phase shifting mask (PSM), interferometric lithography, nanoimprint lithography, or spacer lithography.

In step 602, the portions of the fine-line pattern(s) not needed to implement the circuit design can be removed (or, in the case of spacer lithography, designated for removal) from the first masking layer using a mask. The mask exposes areas in which the fine-line features are not to be retained and protects any desired portion of the fine-line features defined using (or derived from) the first mask. After this exposure, the first masking layer can be patterned using photoresist development or a combination of photoresist development and etching (where a hard masking layer is included in the first masking layer). The patterned first masking layer corresponds to the desired fine-line features of the IC layer.

Figure 7A:
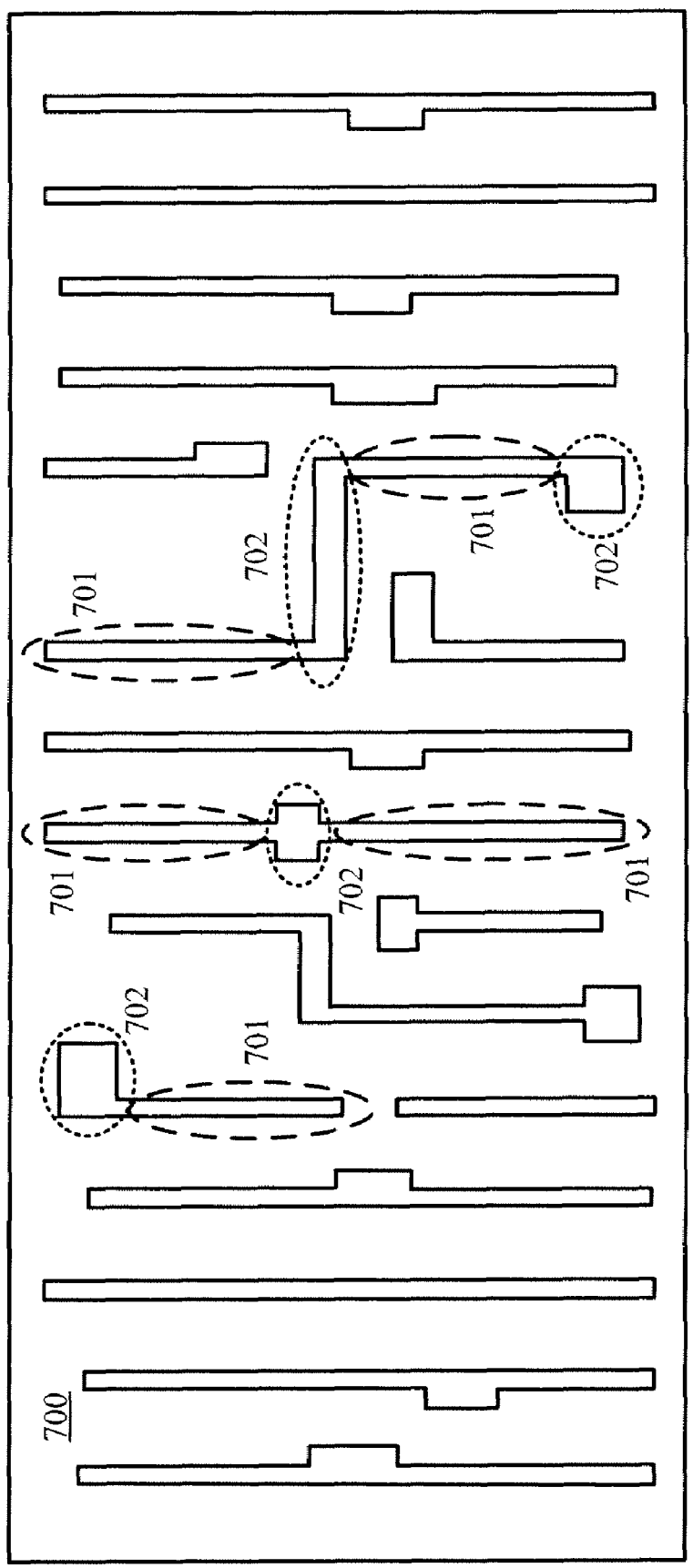
FIGS. 7A, 7B, and 7C illustrate a technique for defining the coarse features of a layout using shrink/grow operations.

In step 603, interconnect and other coarse features of the circuit design can be defined in a second masking layer (e.g. photoresist) formed over the patterned first masking layer. This masking layer is exposed using another mask. The minimum lateral dimension of the features on this mask is greater than the width(s) of the fine-line features and can be equal to or greater than the pitch of the fine-line pattern(s). After this exposure, the second masking layer can be patterned. In one embodiment, defining the coarse features can be derived from a desired feature layout. For example, FIG. 7A illustrates an exemplary feature layout 700 for one layer of a D-type flipflop. Notably, feature layout 700 includes fine-line features

Figure 7B:
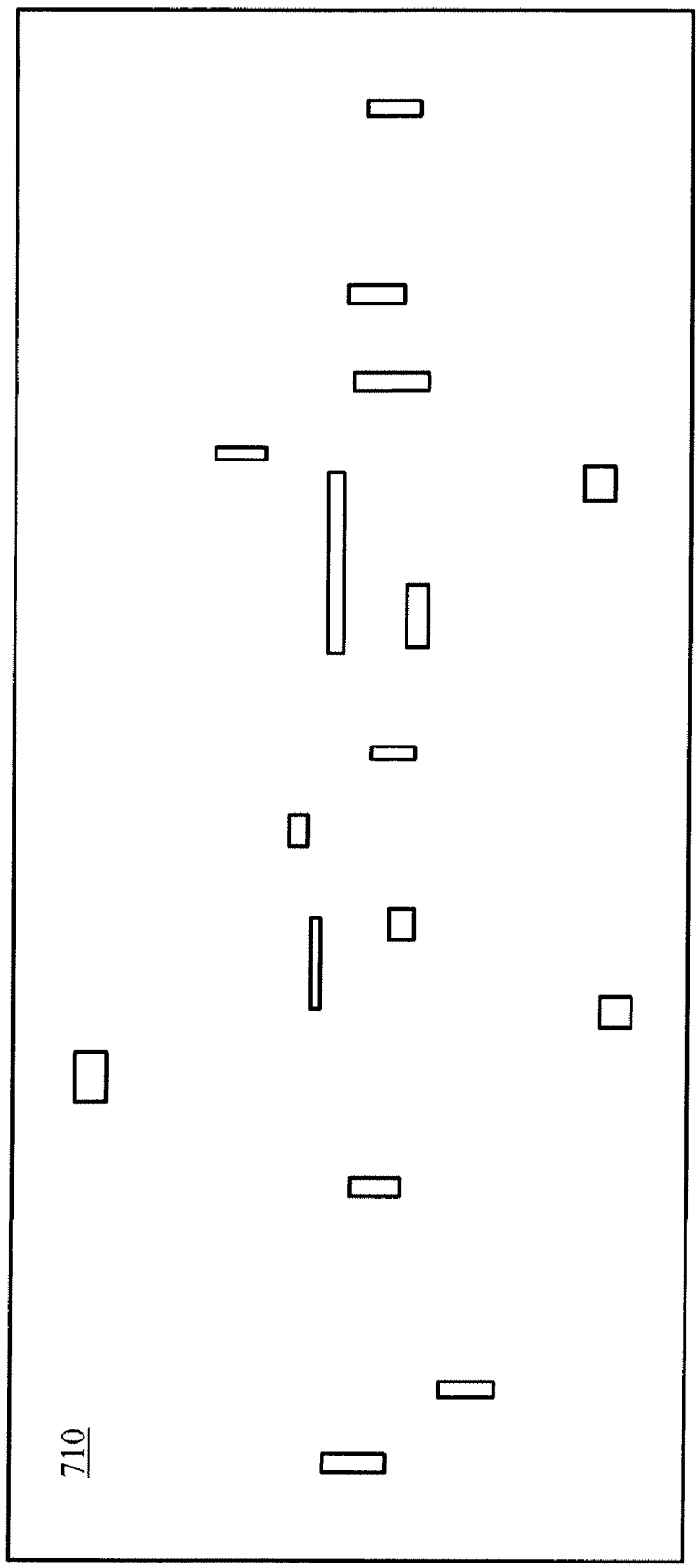
Figure 7C:
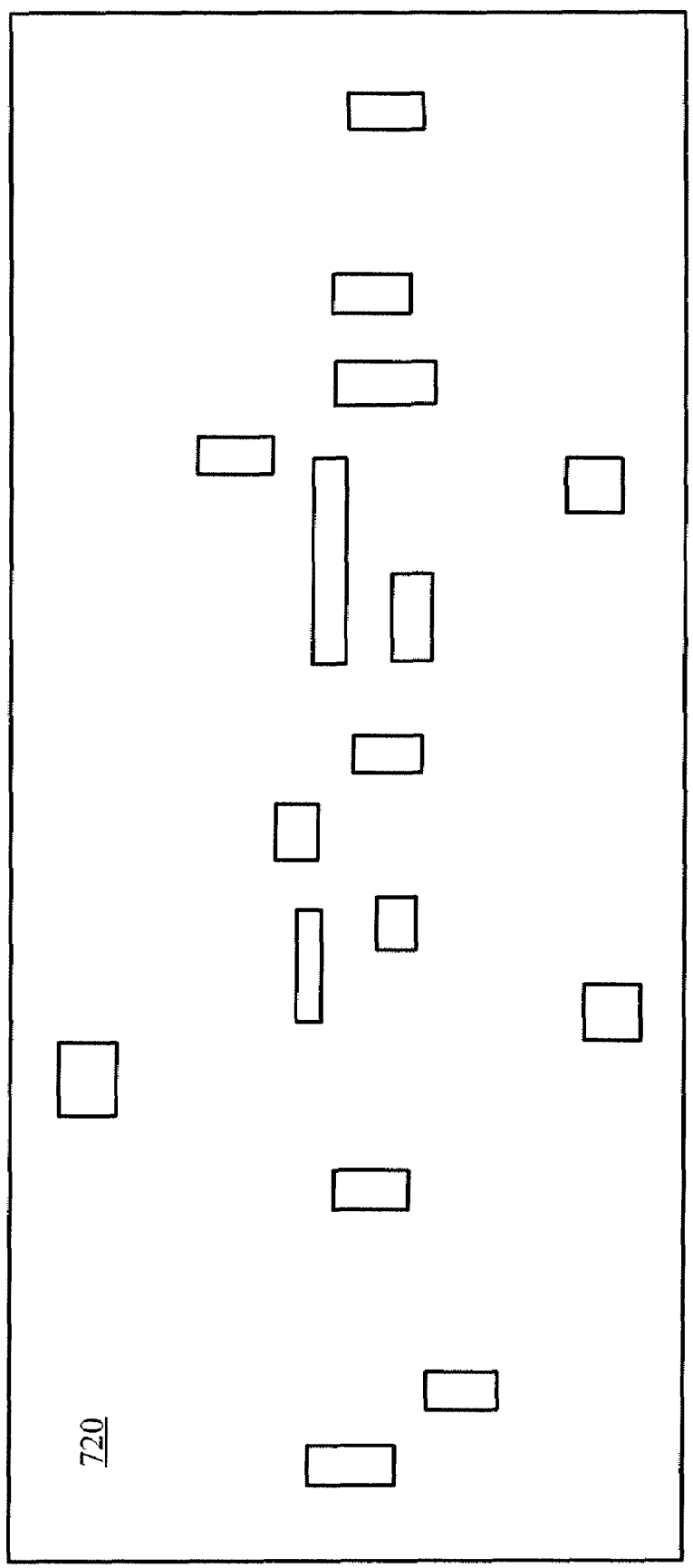

701 and coarse features 702. To define only the coarse features, layout 700 can be shrunk a predetermined amount until fine-line features 701 disappear. FIG. 7B illustrates a layout 710 corresponding to layout 700 after a shrink operation. At this point, layout 710 can be grown by the same predetermined amount, thereby resulting in only the coarse features being present. FIG. 7C illustrates a layout 720 corresponding to layout 710 after a grow operation. This shrink/grow technique can advantageously provide an accurate layout of only the coarse features using simple algorithms. In one embodiment, the shrink/grow amount is at least one-half the width of the fine-line features.

At this point, the underlying IC layer can be patterned in step 604 using the composite mask formed by the patterned first and second masking layers. This patterning can include the etching, isotropic or anistropic (as appropriate), of the IC layer. After the IC layer is patterned, at least the photoresist layer(s) of the first and/or second masking layers, and any other layers unnecessary for IC device fabrication, can be removed.

Note that this multiple mask and multiple masking layer technique results in fine-line features that are oriented in a single direction and that are laid out on a regular grid, within each fine-line pattern. Although imposing some constraints for circuit layout, this technique can advantageously minimize feature variations (for improved yield) as well as facilitate the use of RETs to achieve the most aggressively small feature sizes for optimized circuit performance.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, as noted above, the fine-line features defined in the first masking layer can include be grouped into multiple fine-line patterns, wherein each fine-line pattern includes fine-line features having a common line-width, line-spacing, and line orientation. See, for example, FIG. 3E that shows two fine-line patterns that can be formed. Thus, each fine-line pattern can be optimized as needed for different cells or blocks within an integrated circuit.

In one embodiment, interference lithography can be used to define one or more geometrically regular fine-line patterns in a first masking layer on the surface of the wafer without using a mask. Each feature thusly defined in the first masking layer is sub-wavelength. Moreover, the pitch of each fine-line pattern is less than or equal to that wavelength. Many interferometric lithography tools with various complexity and sophistication of design are available. Either a positive or negative photoresist may be used in the interferometric lithography process.

In another embodiment, imprint lithography can be used to define one or more geometrically regular fine-line patterns in a first masking layer on the surface of the wafer without using a mask. The width of each fine-line feature can be extremely small (less than 10 nm), since the resolution of imprint lithography is limited only by the minimum feature size that can be fabricated in the mold used for imprinting. Moreover, the pitch of each fine-line pattern can be extremely small (less than 10 nm) as well. Several imprint lithography tools are commercially available. Either a positive or negative photoresist may be used in the imprint lithography process. Because the mold used for imprinting defines only fine-line features, it can be used to define (at least in part) the same IC layer in multiple products (e.g. the gate electrode layer for different IC designs). Thus, although its cost may be high due to its fine feature sizes, the mold cost per IC design can be lower than for the conventional case in which a single mold is used to fully define an IC layer.

Portions of the fine-line pattern(s) defined by interferometric lithography or imprint lithography that are not needed to implement the circuit design can then be removed from the first masking layer using a first mask. For a positive photoresist, the first mask exposes areas in which the fine-line features are not to be retained and protects any desired portion of the fine-line features defined using the interferometric or imprint lithography process. The minimum lateral dimension of the features on this first mask can be greater than the pitch of the fine-line pattern(s), which is significantly larger than the width(s) of the fine-line features. Thus, few (if any) RETs are needed to make the first mask. Therefore, the cost of the first mask can be substantially lower than for a single mask used to define the IC layer.

After this exposure, the first masking layer can be patterned via photoresist development or a combination of photoresist development and etching (in the case where a hard masking layer is included in the first masking layer). At this point, the patterned first masking layer directly corresponds to the desired fine-line features of the IC layer.

A second masking layer (e.g. photoresist) can then be used to connect fine-line features of the first masking layer together where desired, and also to form coarse features. This second masking layer is exposed using a second mask. The minimum lateral dimension of the features on this second mask is greater than the width(s) of the fine-line features and can be equal to or greater than the pitch of the fine-line pattern(s). Thus, fewer (if any) RETs, such as optical proximity correction, are needed to make the second mask. Therefore, the cost of the second mask can be substantially lower than for a single mask used to define the IC layer. After this exposure, the second masking layer can be patterned.

At this point, the underlying IC layer can be patterned using the composite mask formed by the patterned first and second masking layers. The IC patterning process can include the etching, isotropic or anistropic (as appropriate), of the IC layer. After the IC layer is patterned, at least the photoresist layer(s) of the first and second masking layers, and any other layers unnecessary for IC device fabrication, can be removed.

Note that the width of the fine-line features in the accessed layout might be larger than the actual width of the fine-line features defined in the first masking layer on the semiconductor substrate. This is because the industry typically "ashes", i.e. shrinks, the photoresist features on the wafer using an oxygen plasma treatment, after the photoresist is exposed and developed. This size difference can be compensated for before the above-described shrink/grow operation.

Accordingly, it is intended that the scope of the invention be defined by the following Claims and their equivalents.

The invention claimed is:

1. A method of transferring a circuit design layout to a layer of an integrated circuit (IC), the method comprising:
   using a resolution enhancement technique (RET) to define one or more fine-line patterns in a first masking layer, wherein the first masking layer is formed on the IC layer, wherein each feature of each fine-line pattern has a dimension less than a wavelength of light used to define the fine-line pattern, wherein a pitch of each fine-line pattern is less than or equal to the wavelength;
   one of removing and designating for removal portions of the fine-line pattern(s) not needed to implement the circuit design, and protecting desired portions of the fine-line features defined in the first masking layer;
patterning the first masking layer, thereby forming a patterned first masking layer;
forming a second masking layer over the patterned first masking layer;
defining a plurality of coarse features of the circuit design layout in the second masking layer, wherein defining the plurality of coarse features includes accessing a desired layout of the layer of an integrated circuit, performing a shrink operation until any fine-line pattern on the desired layout disappears, and performing a grow operation on the shrunk layout so that any coarse feature has substantially a same size as that on the desired layout,
wherein at least one coarse feature is formed to connect two fine-line features;
patterning the second masking layer; and
patterning the IC layer using a composite mask formed by the patterned first masking layer and the patterned second masking layer.

2. The method of claim 1, wherein the RET includes one of a phase shifting mask (PSM), interferometric lithography, nanoimprint lithography, and spacer lithography.

3. The method of claim 1, wherein the step of patterning the first masking layer includes one of a photoresist development and a combination of photoresist development and etching.

4. The method of claim 1, wherein the second masking layer is a photoresist layer.

5. The method of claim 1, wherein the step of defining the plurality of coarse features is performed using a coarse feature mask, wherein depending on a size and a shape of certain coarse features, one or more RETs are used on the coarse feature mask.

6. The method of claim 1, wherein the patterning of the IC layer can include etching of the IC layer.

7. The method of claim 6, further including, after the patterning of the IC layer, removing at least photoresist layers of the first and second masking layers.

8. The method of claim 7, further including, after removing photoresist layers, removing any other layers used in the first and second masking layers that are unnecessary for IC device fabrication.

9. A mask set used in a lithographic process for exposing multiple masking layers, the multiple masking layers used to pattern a single integrated circuit (IC) layer, the IC layer for implementing features of a circuit design, the mask set comprising:
a first mask for defining only fine-line features in a first masking layer, wherein each fine-line feature has a dimension less than a wavelength of a light used to define the fine-line feature;
a second mask for one of removing and designating for removal any portions of the fine-line features not needed to implement the circuit design; and
a third mask for defining a plurality of coarse features of the IC layer in a second masking layer formed over a patterned first masking layer, wherein the plurality of coarse features are derived from a desired layout using a shrink/grow operation, the patterned first masking layer resulting from exposure of the first masking layer using the first and second masks, wherein at least one coarse feature is formed to connect two fine-line features.

10. The mask set of claim 9, wherein the first mask includes phase shifting areas.

11. The mask set of claim 9, wherein, depending on a size and a shape of certain coarse features, the third mask is made using one or more RETs.

12. A lithographic system for patterning an integrated circuit (IC) layer, the IC layer for implementing features of a circuit design, the lithographic system comprising:
a light source; and
a mask set for exposing multiple masking layers using the light source, the mask set comprising:
a first mask for defining only fine-line features in a first masking layer, wherein each fine-line feature has a dimension less than a wavelength of the light, and wherein a pitch of a fine-line pattern, which includes a set of the fine-line features, is less than or equal to the wavelength;
a second mask for one of removing and designating for removal portions of the fine-line features not needed to implement the design; and
a third mask for defining a plurality of coarse features of the IC layer in a second masking layer formed over a patterned first masking layer, wherein the plurality of coarse features are derived from a desired layout using a shrink/grow operation, the patterned first masking layer resulting from exposure of the first masking layer using the first and second masks, wherein at least one coarse feature is defined to connect two fine-line features.

13. The lithographic system of claim 12, wherein the first mask includes phase shifting areas.

14. The lithographic system of claim 12, wherein, depending on a size and a shape of certain coarse features, the third mask is made using one or more RETs.

15. A mask set used in a lithographic process for exposing multiple masking layers, the multiple masking layers used to pattern a single integrated circuit (IC) layer, the IC layer for implementing features of a circuit design, the mask set comprising:
a first mask for one of removing and designating for removal portions of fine-line features defined in a first masking layer, but not needed to implement the circuit design; and
a second mask for defining a plurality of coarse features of the circuit design in a second masking layer formed over a patterned first masking layer, wherein the plurality of coarse features are derived from a desired layout using a shrink/grow operation, the patterned first masking layer resulting at least in part from exposure of the first masking layer using the first mask, wherein at least one coarse feature is defined to connect two fine-line features.

* * * * *